United States Patent
Ha et al.

(10) Patent No.: US 12,272,544 B2
(45) Date of Patent: Apr. 8, 2025

(54) APPARATUS FOR TREATING SUBSTRATE AND METHOD FOR TREATING SUBSTRATE

(71) Applicant: SEMES CO., LTD., Cheonan-si (KR)

(72) Inventors: Do Gyeong Ha, Daegu (KR); Moon Soon Choi, Cheonan-si (KR); Young Joon Han, Cheonan-si (KR); Seung Tae Yang, Yongin-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 34 days.

(21) Appl. No.: 18/145,920

(22) Filed: Dec. 23, 2022

(65) Prior Publication Data

US 2023/0207306 A1    Jun. 29, 2023

(30) Foreign Application Priority Data

Dec. 24, 2021 (KR) .................. 10-2021-0186773
Apr. 20, 2022 (KR) .................. 10-2022-0048731

(51) Int. Cl.
*H01L 21/02* (2006.01)
*B08B 3/02* (2006.01)
(Continued)

(52) U.S. Cl.
CPC ........ *H01L 21/02057* (2013.01); *B08B 3/022* (2013.01); *B08B 13/00* (2013.01);
(Continued)

(58) Field of Classification Search
None
See application file for complete search history.

(56) References Cited

U.S. PATENT DOCUMENTS

2021/0197237 A1* 7/2021 Yun .................. B08B 3/02

FOREIGN PATENT DOCUMENTS

KR    2009-0039019 A    4/2009
KR    2018-0106866 A    10/2018
(Continued)

OTHER PUBLICATIONS

Google Patents translation of KR20090039019A (Year: 2024).*
(Continued)

*Primary Examiner* — Eric W Golightly
(74) *Attorney, Agent, or Firm* — Harness, Dickey & Pierce, P.L.C.

(57) ABSTRACT

Disclosed is a method for treating a substrate in a plurality of chambers. The substrate treating method may include performing liquid treatment on a substrate located in a chamber through a supply line for connecting a circulation line and each of the plurality of chambers while the liquid circulates in the circulation line, wherein a flow rate per unit time of the liquid flowing downstream of a valve provided in the supply line is constantly maintained at a reference flow rate, and controlling an upstream flow rate which is a flow rate per unit time of the liquid flowing upstream of the circulation line rather than the supply lines or a downstream flow rate which is a flow rate per unit time of the liquid flowing downstream of the circulation line rather than the supply lines based on a distribution flow rate which is a flow rate per unit time of the liquid flowing upstream of the valve to maintain the reference flow rate.

16 Claims, 9 Drawing Sheets

(51) Int. Cl.
*B08B 13/00* (2006.01)
*H01L 21/67* (2006.01)
*H01L 21/687* (2006.01)

(52) U.S. Cl.
CPC .. *H01L 21/67051* (2013.01); *H01L 21/68764* (2013.01); *B08B 2203/027* (2013.01)

(56) References Cited

FOREIGN PATENT DOCUMENTS

| KR | 102090015 B1 | 3/2020 |
| KR | 10-2021-0003682 | 1/2021 |
| KR | 2021-0035738 A | 4/2021 |

OTHER PUBLICATIONS

Korean Office Action dated Oct. 25, 2023, issued in corresponding Korean Patent Application No. 10-2022-0048731, 6 pages, not in English.

* cited by examiner

APPARATUS FOR TREATING SUBSTRATE AND METHOD FOR TREATING SUBSTRATE

CROSS-REFERENCE TO RELATED APPLICATIONS

This application claims priority to and the benefit of Korean Patent Application Nos. 10-2021-0186773 and 10-2022-0048731 filed in the Korean Intellectual Property Office on Dec. 24, 2022 and Apr. 20, 2022, the entire contents of which are incorporated herein by reference.

TECHNICAL FIELD

The present invention relates to an apparatus and a method for treating a substrate, and more particularly, to a substrate treating apparatus and a substrate treating method for liquid-treating a substrate.

BACKGROUND ART

In general, in order to manufacture a semiconductor device, various processes such as a photo process, an etching process, an ion implantation process, and a deposition process are performed. In addition, impurities (byproducts) such as particles and organic contaminants are generated in the process of performing these processes. These impurities are attached to the substrate and act as defect factors that directly affect the performance and yield of semiconductor devices. A manufacturing process of the semiconductor device necessarily involves a cleaning process to remove these impurities.

When the cleaning process is performed in the chamber, the flow rate of a liquid supplied to the substrate located in the chamber needs to be kept constant. When an excessive flow rate of the liquid is supplied to the substrate, various thin films or patterns formed on the substrate are damaged. On the contrary, when an insufficient flow rate of the liquid is supplied to the substrate, the impurities attached to the substrate are not removed. When a subsequent process is performed while the impurities are attached to the substrate, it is impossible to smoothly treat the substrate in the subsequent process.

In general, a constant pressure valve is used to maintain constantly a flow rate supplied to the substrate. However, when the flow rate per unit time of the liquid flowing into the constant pressure valve increases, the pressure of the liquid transmitted to the constant pressure valve increases. When the pressure of the liquid transmitted to the constant pressure valve increases, damage to the constant pressure valve occurs. The constant pressure valve is damaged so that particles are generated, and the particles are introduced into the chamber and attached to the substrate located in the chamber. As described above, this results in defects of the substrate. In addition, when the flow rate per unit time of the liquid flowing into the constant pressure valve decreases, the pressure of the liquid transmitted to the constant pressure valve decreases, thereby making it difficult to supply an appropriate flow rate to the substrate located in the chamber. In addition, as described above, the impurities attached to the substrate are not efficiently removed, resulting in defects of the substrate in a subsequent process.

SUMMARY OF THE INVENTION

An object of the present invention is to provide an apparatus and a method for treating a substrate capable of efficiently treating the substrate.

Another object of the present invention is to provide a substrate treating apparatus and a substrate treating method capable of supplying a constant flow rate of liquid to the substrate. Yet another object of the present invention is to provide a substrate treating apparatus and a substrate treating method capable of constantly maintaining a flow rate of liquid supplied to a chamber by adjusting a flow rate per unit time of the liquid in a circulation line in which the liquid circulates.

Still another object of the present invention is to provide a substrate treating apparatus and a substrate treating method capable of constantly maintaining a flow rate of liquid supplied to each chamber even if the number of chambers supplied with liquid is changed.

Other objects of the present invention are not limited thereto, and other objects, which are not mentioned above, will be apparent to those skilled in the art from the following description.

An exemplary embodiment of the present invention provides a method for treating a substrate in a plurality of chambers. The substrate treating method may include performing liquid treatment on a substrate located in a chamber through a supply line for connecting a circulation line and each of the plurality of chambers while the liquid circulates in the circulation line, wherein a flow rate per unit time of the liquid flowing downstream of a valve provided in the supply line is constantly maintained at a reference flow rate, and controlling an upstream flow rate which is a flow rate per unit time of the liquid flowing upstream of the circulation line rather than the supply lines or a downstream flow rate which is a flow rate per unit time of the liquid flowing downstream of the circulation line rather than the supply lines based on a distribution flow rate which is a flow rate per unit time of the liquid flowing upstream of the valve to maintain the reference flow rate.

According to the exemplary embodiment, a pump and a first electro-pneumatic regulator may be provided at an upstream of the circulation line to supply the liquid downstream of the circulation line using a fluid pressure, and the first electro-pneumatic regulator may control the upstream flow rate by feeding-back distribution flow rate data and changing the fluid pressure supplied to the pump.

According to the exemplary embodiment, back pressure valve and a second electro-pneumatic regulator may be provided at a downstream of the circulation line to change an opening rate according to the pressure, and the second electro-pneumatic regulator may change the pressure supplied to the back pressure valve by feeding-back the distribution flow rate data, and change the opening rate according to the changed pressure to control the downstream flow rate.

According to the exemplary embodiment, the method may include a first state in which the liquid treatment is performed in at least one of the plurality of chambers and a second state in which the liquid treatment is performed in a relatively smaller number of chambers than that of the first state, and in each of the first state and the second state, the upstream flow rate or the downstream flow rate may be controlled differently from each other.

According to the exemplary embodiment, in the second state, the fluid pressure supplied to the pump may be further reduced than that in the first state, and the upstream flow rate in the second state may be controlled to be smaller than the upstream flow rate in the first state.

According to the exemplary embodiment, in the second state, the fluid pressure supplied to the back pressure valve may be further reduced than that in the first state to increase the opening rate, and the downstream flow rate in the second state may be controlled to be greater than the downstream flow rate in the first state.

According to the exemplary embodiment, the upstream flow rate in the second state may be controlled to be smaller than the upstream flow rate in the first state, and the downstream flow rate in the second state may be controlled to be greater than the downstream flow rate in the first state.

According to the exemplary embodiment, the valve may be a constant pressure valve, a flow meter located upstream of the constant pressure valve may be provided in each of the supply lines, and the distribution flow rate is measured using the flow meter, and the opening rate of the constant pressure valve may be maintained constantly while the liquid treatment on the substrate is performed.

Another exemplary embodiment of the present invention provides a method for treating a substrate. The substrate treating method may include supplying a liquid supplied from a pump to a substrate located in a chamber through a supply line connecting a circulation line and the chamber while circulating the liquid in the circulation line, wherein a flow rate per unit time of the liquid flowing downstream of a valve provided in the supply line is constantly maintained at a reference flow rate, and changing a downstream flow rate which is a flow rate per unit time of the liquid flowing downstream of the circulation line according to a change value of a distribution flow rate which is a flow rate per unit time of the liquid flowing upstream of the valve to maintain the reference flow rate.

According to the exemplary embodiment, the downstream flow rate may be changed in proportion to the change value of the distribution flow rate.

According to the exemplary embodiment, a back pressure valve and an electro-pneumatic regulator may be provided at a downstream of the circulation line to change an opening rate according to the pressure, and the electro-pneumatic regulator may change the pressure supplied to the back pressure valve according to a change value of the distribution flow rate and the downstream flow rate may be changed by changing the opening rate according to the changed pressure.

According to the exemplary embodiment, when the distribution flow rate is changed from a first flow rate to a second flow rate having a greater flow rate per unit time than the first flow rate, the electro-pneumatic regulator may change the pressure supplied to the back pressure valve from a first pressure to a second pressure smaller than the first pressure so that the opening rate increases.

According to the exemplary embodiment, when the distribution flow rate is changed from a second flow rate to a first flow rate having a smaller flow rate per unit time than the second flow rate, the electro-pneumatic regulator may change the pressure supplied to the back pressure valve from a second pressure to a first pressure greater than the second pressure so that the opening rate decreases.

According to the exemplary embodiment, the distribution flow rate may be changed according to a capacity of the pump or the number of chambers supplying the liquid to the substrate.

According to the exemplary embodiment, the valve may be a constant pressure valve, a flow meter located upstream of the constant pressure valve may be provided in each of the supply lines, and the distribution flow rate is measured using the flow meter, and the opening rate of the constant pressure valve may be maintained constantly while the liquid treatment on the substrate is performed.

Yet another exemplary embodiment of the present invention provides an apparatus for treating a substrate. The substrate treating apparatus may include a chamber in which liquid treatment on the substrate is performed, a circulation line through which the liquid circulates, a supply line provided with a constant pressure valve and supplying the liquid to the substrate located in the chamber, and a controller, in which the circulation line may include a pump provided at an upstream of the circulation line and supplying the liquid from a tank to a downstream of the circulation line by using a fluid pressure and a back pressure valve provided at a downstream of the circulation line to change an opening rate according to the pressure, the supply line may be connected to a position in the circulation line between a position where the pump is provided and a position where the back pressure valve is provided in the circulation line, and the controller may control an upstream flow rate which is a flow rate per unit time of the liquid flowing upstream of the circulation line rather than the supply lines or a downstream flow rate which is a flow rate per unit time of the liquid flowing downstream of the circulation line rather than the supply lines based on a distribution flow rate which is a flow rate per unit time of the liquid flowing upstream of the valve to constantly maintain flow rate per unit time of the liquid flowing downstream of the constant pressure valve to the reference flow rate, while supplying the liquid to the chamber through the supply line.

According to the exemplary embodiment, a first electro-pneumatic regulator may be further provided at an upstream of the circulation line to control the upstream flow rate based on the distribution flow rate data, and a second electro-pneumatic regulator may be further provided at a downstream of the circulation line to control the downstream flow rate based on the distribution flow rate data.

According to the exemplary embodiment, a plurality of chambers may be provided, the supply line may connect the circulation line and each of the plurality of chambers independently of each other, and the controller may control the first electro-pneumatic regulator to control the upstream flow rate by feeding-back distribution flow rate data and changing the fluid pressure supplied to the pump, and controls the second electro-pneumatic regulator to change the pressure supplied to the back pressure valve by feeding-back the distribution flow rate data, change the opening rate according to the changed pressure to control the downstream flow rate and maintain the reference flow rate.

According to the exemplary embodiment, in a first state in which the liquid treatment is performed in at least one of the plurality of chambers and a second state in which the liquid treatment is performed in a relatively smaller number of chambers than that of the first state, the controller may control the first electro-pneumatic regulator or the second electro-pneumatic regulator so that the upstream flow rate in the second state is controlled to be smaller than the upstream flow rate in the first state.

According to the exemplary embodiment, the controller may control the first electro-pneumatic regulator or the second electro-pneumatic regulator so that the downstream flow rate in the second state is controlled to be greater than the downstream flow rate in the first state.

According to the exemplary embodiment of the present invention, it is possible to efficiently treat the substrate.

Further, according to the exemplary embodiment of the present invention, it is possible to supply a constant flow rate of liquid to the substrate.

Further, according to the exemplary embodiment of the present invention, it is possible to constantly the flow rate of the liquid supplied to the chamber by adjusting the flow rate per unit time of the liquid in the circulation line in which the liquid circulates.

Further, according to the exemplary embodiment of the present invention, it is possible to constantly maintain the flow rate of the liquid supplied to each chamber even if the number of chambers to which the liquid is supplied is changed.

The effect of the present invention is not limited to the foregoing effects, and non-mentioned effects will be clearly understood by those skilled in the art from the present specification and the accompanying drawings.

DETAILED DESCRIPTION

Figure 1:
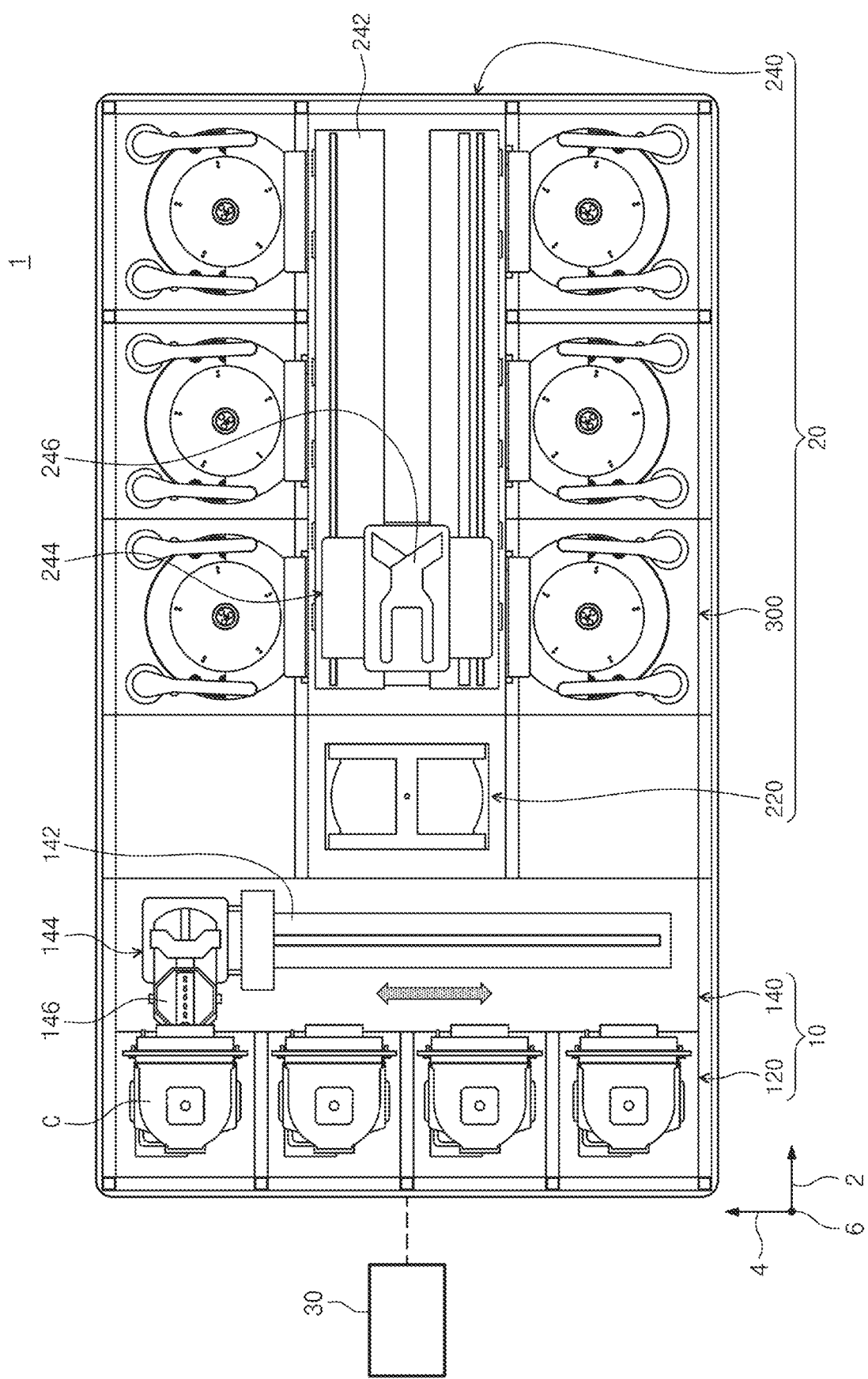
FIG. 1 is a diagram schematically illustrating an exemplary embodiment of a substrate treating apparatus of the present invention.

Hereinafter, exemplary embodiments of the present invention will be described in more detail with reference to the accompanying drawings. Exemplary embodiments of the present invention may be modified in various forms and should not be construed that the scope of the present invention is limited to exemplary embodiments to be described below. The exemplary embodiments will be provided for more completely explaining the present invention to those skilled in the art. Therefore, shapes, and the like of components in the drawings are exaggerated to emphasize a more clear description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

In the exemplary embodiment, a process of liquid-treating a substrate by supplying a liquid such as a cleaning liquid onto the substrate will be described as an example. However, the present exemplary embodiment to be described below is not limited to a cleaning process, but may be applied to various processes for treating a substrate W using a liquid, such as an etching process, an ashing process, or a developing process.

Hereinafter, an example of a substrate treating apparatus of the present invention will be described in detail with reference to FIGS. 1 to 9.

FIG. 1 is a top plan view schematically illustrating an embodiment of a substrate treating apparatus of the present invention. Referring to FIG. 1, a substrate treating apparatus 1 includes an index module 10 and a treating module 20. According to the exemplary embodiment, the index module 10 and the treating module 20 are disposed along one direction. Hereinafter, the direction in which the index module 10 and the treating module 20 are disposed is defined as a first direction 2. When viewed from the top, a direction vertical to the first direction 2 is referred to as a second direction 4, and a direction vertical to a plane including both the first direction 2 and the second direction 4 is referred to as a third direction 6.

The index module 10 transfers the substrate W to the treating module 20 for treating the substrate W from a cassette C in which the substrate W is accommodated. The index module 10 accommodates the substrate W that has been treated in the treating module 20 into the cassette C. In addition, the index module 10 accommodates the substrate W that is to be treated in the treating module 20 into the cassette C. The index module 10 may have a longitudinal direction parallel to the second direction 4. The index module 10 has a load port 120 and an index frame 140.

The cassette C in which the substrate W is accommodated is seated on the load port 120. The load port 120 is located on an opposite side of the treating module 20 based on the index frame 140. The index module 10 may have a plurality of load ports 120. The plurality of load ports 120 may be disposed in a line along the second direction 4. The number of load ports 120 may increase or decrease according to process efficiency, footprint conditions, and the like of the treating module 20.

A plurality of slots (not illustrated) is provided in the cassette C. The substrates W may be seated on the slots (not illustrated). The plurality of slots (not illustrated) is disposed to be spaced apart from each other along the third direction 6. The substrates W may be seated on the slots (not illustrated) and accommodated in the cassette C while being horizontally disposed on the ground.

As the cassette C, a sealed container such as a front opening unified pod (FOUP) may be used. The cassette C may be placed on the load port 120 by a transfer means (not illustrated) such as an overhead transfer, an overhead conveyor, or an automatic guided vehicle or by an operator.

An index rail 142 and an index robot 144 are located inside the index frame 140. The index rail 142 has a longitudinal direction of a direction parallel to the second direction 4 in the index frame 140. The transfer robot 144 transfers the substrate W. The index robot 144 may transfer the substrate W between the index port 10 and a buffer unit 220 to be described below.

The index robot 144 includes an index hand 146. The substrate W is seated on the index hand 146. The index hand 146 may move along the second direction 4 on the index rail 142. Accordingly, the index hand 146 may move forward and backward along the index rail 142. In addition, the index hand 146 may rotate in the third direction 6 as an axis. In addition, the index hand 146 may vertically move along the third direction 6. The index robot 144 may include a plurality of index hands 146. The plurality of index hands 146 may be spaced apart from each other in a vertical direction. The plurality of index hands 146 may independently move forward and backward, and rotate.

The controller 15 may control the substrate treating apparatus 1. The controller 15 may include a process controller consisting of a microprocessor (computer) executing a control of the substrate treating apparatus 1, a user interface consisting of a keyboard for performing a command input operation and the like to manage the substrate treating apparatus 1 by an operator or a display and the like for visualizing and displaying an moving situation of the substrate treating apparatus 1, and a memory unit stored with control programs for executing treatment performed in the substrate treating apparatus 1 under control of a process controller or programs, that is, treatment recipes for executing the treatment in each configuration unit according to various data and treatment conditions. In addition, the user interface and the memory unit may be connected to the process controller. The treatment recipes may be stored in a storage medium of the memory unit, and the storage medium may be a hard disk, and may also be a transportable disk such as a CD-ROM and a DVD, or a semiconductor memory such as a flash memory.

The controller 15 may control the substrate treating apparatus 1 to perform a substrate treating method to be described below. For example, the controller 15 may control components included in the liquid supply unit 400 to be described below to perform a substrate treating method to be described below.

The treating module 20 includes a buffer unit 220, a transfer frame 240, and a chamber 300. The buffer unit 220 provides a buffer space where the substrate W carried into the treating module 20 and the substrate W carried out from the treating module 20 temporarily stay. The transfer frame 240 provides a transfer space for transferring the substrate W between the buffer unit 220 and the chamber 300.

The chamber 300 may perform a liquid treating process of liquid-treating the substrate W. For example, the liquid treating process performed in the chamber 300 may be a cleaning process of cleaning the substrate W by supplying a cleaning liquid to the substrate W. According to the exemplary embodiment, chemical treatment, rinse treatment, and drying treatment may all be performed on the substrate W in the chamber 300. However, unlike the above-described example, a drying chamber (not illustrated) different from the chamber 300 is coupled to the treating module 20, chemical treatment and rinse treatment are performed on the substrate W in the chamber 300, and drying treatment may be performed in a drying chamber (not illustrated).

The buffer unit 220 may be disposed between the index module 140 and the transfer frame 240. The buffer unit 220 may be located at one end of the longitudinal direction of the transfer frame 240. Slots (not illustrated) on which the substrate W is placed are provided inside the buffer unit 220. A plurality of slots (not illustrated) may be provided inside the buffer unit 220. The plurality of slots (not illustrated) may be disposed to be spaced apart from each other along the third direction 6. The buffer unit 220 has opened front face and rear face. The front face may be a face facing the index module 140, and the rear face may be a face facing the transfer frame 240. The index robot 144 approaches the buffer unit 220 through the front face, and the transfer robot 244 to be described below may approach the buffer unit 220 through the rear face.

The transfer frame 240 may have a longitudinal direction of a direction parallel to the first direction 2. The chambers 300 may be disposed on the side of the transfer frame 240. The transfer frame 240 and the chamber 300 may be disposed along the second direction 4.

According to an example, the chambers 300 may be disposed at both sides of the transfer frame 240, and the chambers 300 may be disposed in an array of A×B (A and B are natural numbers of 1 or greater than 1, respectively) along the first direction 2 and the third direction 6 on one side of the transfer frame 240, respectively. Here, A represents the number of chambers 300 disposed in a line along the first direction 2, and B represents the number of chambers 300 disposed in a line along the third direction 6.

For example, when 4 or 6 chambers 300 are provided on one side of the transfer frame 240, the chambers 300 may be disposed in an array of 2×2 or 3×2. The number of chambers 300 may also increase or decrease. Unlike those described above, the chamber 300 may be provided only on one side of the transfer frame 240. In addition, the chamber 300 may be provided in a single layer on one side surface and both side surfaces of the transfer frame 240.

The transfer frame 240 has a guide rail 242 and a transfer robot 244. The guide rail 242 and the transfer robot 244 are located inside the transfer frame 240. The guide rail 242 may have a longitudinal direction of a direction parallel to the first direction 2. The transfer robot 244 may move in a straight line along the first direction 2 on the guide rail 242. The transfer robot 244 transfers the substrate W between the buffer unit 220 and the chamber 300.

The transfer robot 244 includes a transfer hand 246 on which the substrate W is placed. The transfer hand 246 may move along the second direction 2 on the index rail 242. Accordingly, the transfer hand 246 may move forward and backward along the guide rail 242. In addition, the transfer hand 246 may rotate in the third direction 6 as an axis. In addition, the transfer hand 246 may vertically move along the third direction 6. The transfer robot 244 may include a plurality of transfer hands 246. The plurality of transfer hands 246 may be provided to be spaced apart from each other in a vertical direction. The plurality of transfer hands 246 may independently move forward and backward, and rotate. The chamber 300 may perform a liquid treating process. The liquid treating process may be a cleaning process that removes process byproducts or byproducts such as particles attached to the substrate W. The chamber 300 may have various structures according to a type of process for treating the substrate W. Unlike this, the respective chambers 300 may have the same structure as each other.

Figure 2:
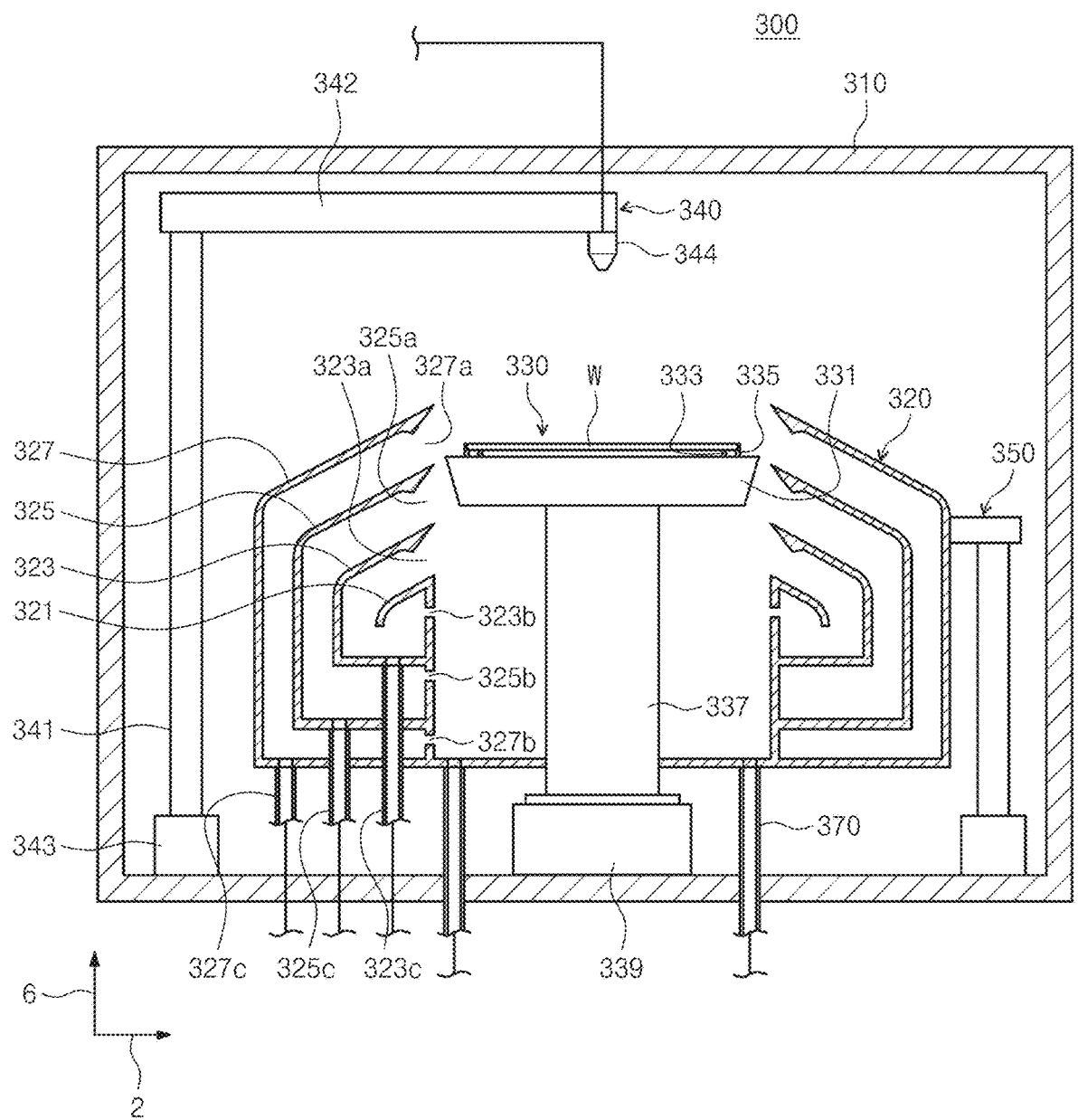
FIG. 2 is a diagram schematically illustrating an exemplary embodiment of a chamber of FIG. 1.

FIG. 2 is a diagram schematically illustrating an embodiment of the chamber of FIG. 1. Referring to FIG. 2, the chamber 300 may include a housing 310, a treating container 320, a support unit 330, and a nozzle unit 340.

The housing 310 has an inner space. The housing 310 may have a substantially rectangular parallelepiped shape. An opening (not illustrated) may be formed in one side wall of the housing 310. The opening (not illustrated) functions as an entrance through which the substrate W is carried into or carried out from the inner space of the housing 310 by the transfer robot 244. The treating container 320, the support unit 330, and the nozzle unit 340 are located in the inner space of the housing 310.

The treating container 320 has a treating space with an opened upper portion. The treating container 320 may be a bowl having a treating space. The treating space functions as a space in which the support unit 330 to be described below supports and rotates the substrate W. In addition, the treating space functions as a space in which the nozzle unit 340 to be described below supplies a liquid onto the substrate W to treat the substrate W.

According to an example, the treating container 320 may have a guide wall 321 and a plurality of recovery tanks 323, 325, and 327. The respective recovery tanks 323, 325, and 327 separate and recover different types of liquids among liquids used for treating the substrate W. The recovery tanks 323, 325, and 327 have recovery spaces that recover the liquids used for treating the substrate W, respectively.

The guide wall 321 and the recovery tanks 323, 325, and 327 are provided in an annular ring shape of surrounding the support unit 330. When the liquid is supplied onto the substrate W, the liquid scattered by the rotation of the substrate W may be introduced into the recovery spaces through inlets 323a, 325a, and 327a of the respective recovery tanks 323, 325, and 327 to be described below. Different types of liquids may be introduced into the respective recovery tanks 323, 325, and 327.

The treating container 320 has the guide wall 321, the first recovery tank 323, the second recovery tank 325, and the third recovery tank 327. The guide wall 321 has an annular ring shape of surrounding the support unit 330. The first recovery tank 323 has an annular ring shape surrounding the guide wall 321. The second recovery tank 325 has an annular ring shape of surrounding the first recovery tank 323. The third recovery tank 327 has an annular ring shape of surrounding the second recovery tank 325.

A space between the guide wall 321 and the first recovery tank 323 functions as the first inlet 323a through which the liquid is introduced. The space between the first recovery tank 323 and the second recovery tank 325 functions as the second inlet 325a through which the liquid is introduced. The space between the second recovery tank 325 and the third recovery tank 327 functions as the third inlet 327a through which the liquid is introduced. The second inlet 325a may be located above the first inlet 323a, and the third inlet 327a may be located above the second inlet 325a. The liquid introduced into the first inlet 323a, the liquid introduced into the second inlet 325a, and the liquid introduced into the third inlet 327a may be different types of liquids.

A space between a lower end of the guide wall 321 and the first recovery tank 323 functions as a first outlet 323b through which impurities and airflow generated from the liquid are discharged. A space between a lower end of the first recovery tank 323 and the second recovery tank 325 functions as a second outlet 325b through which the impurities and airflow generated from the liquid are discharged. A space between a lower end of the second recovery tank 323 and the third recovery tank 327 functions as a third outlet 327b through which the impurities and airflow generated from the liquid are discharged. The impurities and airflow discharged from the first outlet 323b, the second outlet 325b, and the third outlet 327b are discharged to the outside of the chamber 300 through the exhaust unit 370 to be described below.

Recovery lines 323c, 325c, and 327c extending downward are connected to the bottom surfaces of the respective recovery tanks 323, 325, and 327. The respective recovery lines 323c, 325c, and 327c discharge the liquid introduced through the respective recovery tanks 323, 325, and 327. The discharged liquid may be recycled in an external regeneration system (not illustrated) and reused.

The support unit 330 may support and rotate the substrate W in the treating space. The support unit 330 may include a spin chuck 331, a support pin 333, a chuck pin 335, a rotation shaft 337, and a driver 339.

The spin chuck 331 has a substantially circular upper surface when viewed from the top. The upper surface of the spin chuck 331 may have a diameter greater than the substrate W. A plurality of support pins 333 are disposed on the upper surface of the spin chuck 331. The plurality of support pins 333 are disposed on an edge portion of the upper surface of the spin chuck 331 to be spaced apart from each other at regular intervals. The support pins 333 support an edge region of a rear surface of the substrate W so that the substrate W is spaced apart from the upper surface of the spin chuck 331 at a predetermined distance. A plurality of chuck pins 335 are disposed on the upper surface of the spin chuck 331. The chuck pins 335 are disposed relatively farther from a central region of the spin chuck 331 than the support pins 333. When the substrate W rotates, the chuck pins 335 support the side surface of the substrate W so as not to deviate from an original position in a lateral direction.

The rotation shaft 337 is coupled with the spin chuck 331. The rotation shaft 337 is coupled with the lower surface of the spin chuck 331. The rotation shaft 337 may have a longitudinal direction of a direction horizontal with the third direction 6. The rotation shaft 337 may rotate by receiving power from the driver 339. The rotation shaft 337 is rotated by the driver 339, and the spin chuck 331 is rotated via the rotation shaft 337. The driver 339 rotates the rotation shaft 337. The driver 339 may vary a rotation speed of the rotation shaft 337. The driver 339 may be a motor for generating a driving force. However, the present invention is not limited thereto and the driver 399 may be variously modified to known devices for generating the driving force.

The nozzle unit 340 supplies a liquid onto the substrate W. The nozzle unit 340 supplies the liquid onto the substrate W supported by the support unit 330. The liquid supplied to the substrate W by the nozzle unit 340 may vary. The nozzle unit 340 may include a support rod 341, an arm 342, a driver 343, and a supply nozzle 344.

The support rod 341 is located in the inner space of the housing 310. The support rod 341 may be located on one side of the treating container 320 in the inner space. The support rod 341 may have a rod shape having a longitudinal direction of a direction parallel to the third direction 6. The support rod 341 may rotate in the third direction 6 as an axis by the driver 343 to be described below.

The arm 342 is coupled to the upper end of the support rod 341. The arm 342 extends vertically to the longitudinal direction of the support rod 341. The supply nozzle 344 to be described below may be fixedly coupled to an end of the arm 342. The arm 342 may move forward and backward along the longitudinal direction thereof. The arm 342 may be swing-moved by the driver 343 for rotating the support rod 341 via the support rod 341. The driver 343 is coupled to the support rod 341. The driver 343 is disposed on the bottom surface of the housing 310. The driver 343 generates a driving force for rotating the support rod 341. The driver 343 may be a known motor for generating a driving force.

The supply unit 344 supplies a liquid onto the substrate W supported by the support unit 330. The supply nozzle 344 supplies the liquid received from the liquid supply unit 400 to be described below to the substrate W. The supply nozzle 344 may supply the same type of liquid to the substrate W. Optionally, the supply nozzle 344 may supply different types of liquids to the substrate W. The supply nozzle 344 is coupled to the arm 342 and may be swing-moved between a process position and a standby position by rotation of the arm 342. The process position may be a position facing the substrate W supported by the support unit 330. According to an example, the process position may be a position where the center of the supply nozzle 344 faces the center of the substrate W supported by the support unit 330. The standby position may be a position where the supply nozzle 344 does not overlap with the substrate W when viewed from the top.

Unlike the above-described exemplary embodiment of the present invention, a plurality of supply nozzles 344 are provided on the arm 342, and the plurality of supply nozzles 344 may supply different types of liquids onto the substrate W. Optionally, each of the plurality of supply nozzles 344 may independently have an arm, a support rod, and a driver, and independently swing-move and move forward and backward to move between the process position and the standby position.

An elevation unit 350 is disposed in the inner space of the housing 310. The elevation unit 350 controls a relative height between the treating container 320 and the support unit 330. The elevation unit 350 linearly moves the treating container 320 in the third direction 6. As a result, since the heights of the recovery tanks 323, 325, and 327 for recovering the liquid are changed according to a type of liquid supplied to the substrate W, the liquids may be separately recovered. Unlike the above, the treating container 320 is fixedly provided, and the elevation unit 350 moves the support unit 330 up and down to change the relative height between the support unit 330 and the treating container 320.

The exhaust unit 370 discharges impurities generated in the treating space. A decompression unit (not illustrated) is provided in the exhaust unit 370. The exhaust unit 370 may be coupled to the bottom surface of the treating container 320. For example, the exhaust unit 370 may be coupled to a point between the rotation shaft 337 and an inner wall of the treating container 320 on the bottom surface of the treating container 320.

Figure 3:
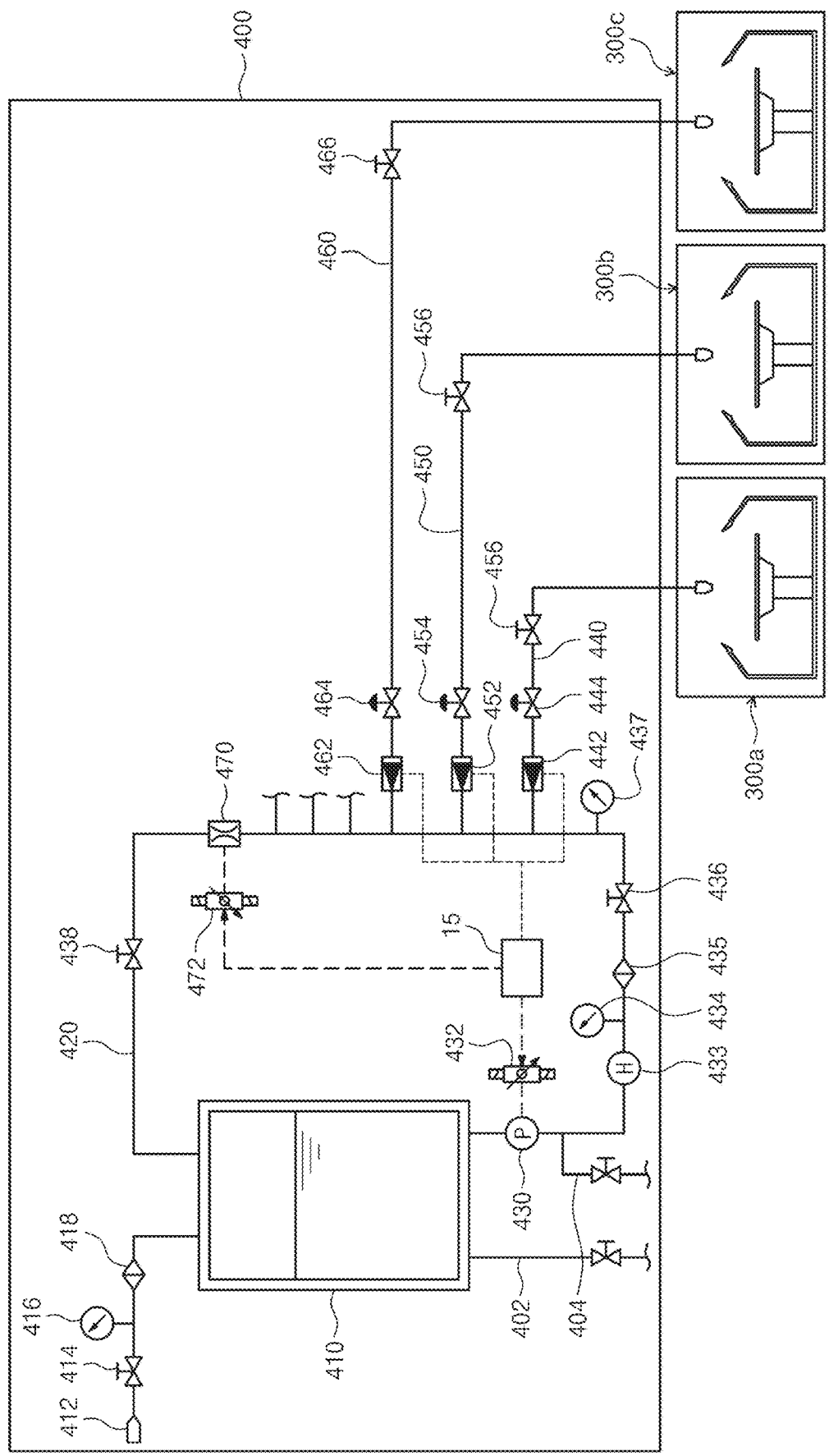
FIG. 3 is a diagram schematically illustrating an exemplary embodiment of a liquid supply unit.
Figure 4:
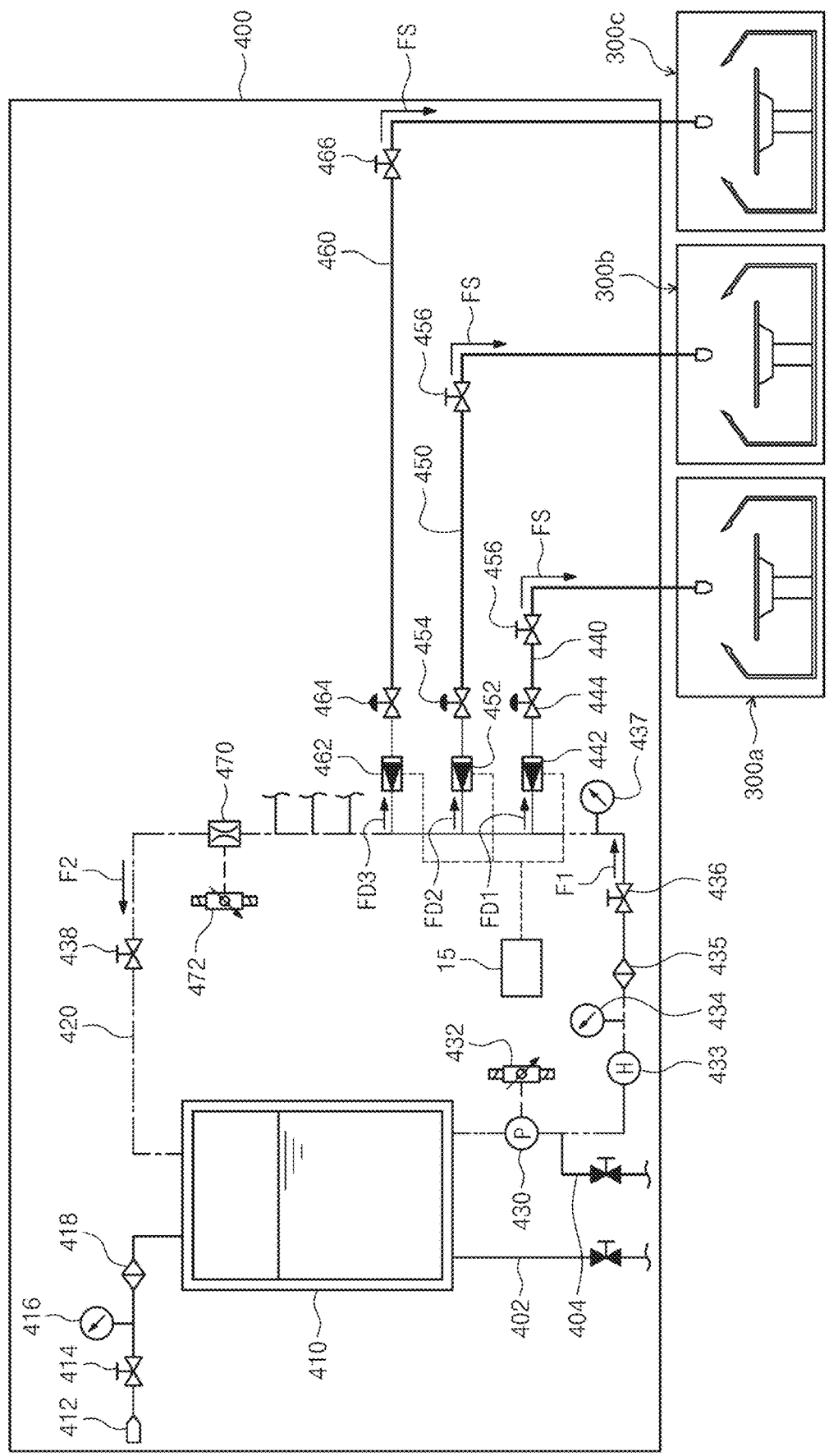
FIG. 4 is a diagram schematically illustrating a state in which the liquid supply unit of FIG. 3 supplies a liquid to a chamber in a first state.

FIG. 3 is a diagram schematically illustrating an embodiment of a liquid supply unit. Referring to FIGS. 3 and 4, the liquid supply unit 400 supplies a liquid to the chamber 300. The liquid supply unit 400 supplies the liquid onto the nozzle 344. The nozzle 344 receiving the liquid from the liquid supply unit 400 supplies the liquid to the substrate W supported by the support unit 330. The liquid transmitted to the nozzle 344 by the liquid supply unit 400 may include various types of liquids.

According to the exemplary embodiment, the liquid supply unit 400 may transmit at least one of a chemical, a rinse liquid, and an organic solvent to the supply nozzle 344. For example, the chemical may include diluted sulfuric acid peroxide (H2SO4), phosphoric acid (P2O5), hydrofluoric acid (HF), and ammonium hydroxide (NH4OH). For example, the rinse liquid may include pure water or deionized water (DIW). For example, the organic solvent may include alcohol such as isopropyl alcohol (IPA). However, the present invention is not limited thereto, and the liquid transmitted to the supply nozzle 344 by the liquid supply unit 400 may include various known liquids. Hereinafter, for convenience of understanding, a case in which the liquid supplied to the supply nozzle 344 by the liquid supply unit 400 is an organic solvent will be described as an example. In addition, hereinafter, when the liquid flows from one point to the other point, one point through which the liquid flows is defined as an upstream, and the other point through which the liquid flows is defined as a downstream.

The liquid supply unit 400 may include a tank 410, a circulation line 420, a pump 430, supply lines 440, 450, and 460, and a back pressure valve 470.

The tank 410 has a storage space therein. The liquid is stored in the storage space of the tank 410. Level sensors (not illustrated) may be provided in the tank 410. The level sensors (not illustrated) may detect the level of the liquid stored in the storage space.

The tank 410 is connected to a first discharge line 402. A decompression member (not illustrated) is provided in the first discharge line 402 to drain the liquid stored in the storage space of the tank 410 to the outside of the liquid supply unit 400.

In addition, the tank 410 is connected to a supply source 412. The supply source 412 supplies the liquid to the tank 410. A first valve 414, a first pressure gauge 416, and a first filter 418 may be provided in the line 411 connecting the supply source 412 and the tank 410. The first valve 414, the first pressure gauge 416, and the first filter 418 may be sequentially provided in a direction from the upstream to the downstream of the line 411. The first valve 414 may be an opening/closing valve that opens and closes the line 411. When the first valve 414 is opened, the liquid stored in the supply source 412 flows into the tank 410. The first pressure gauge 416 may measure the pressure of the liquid flowing through the line 411. A flow rate per unit time of the liquid flowing through the line 411 may be determined from the pressure measured by the first pressure gauge 416. The first filter 418 removes impurities that may be included in the liquid flowing through the line 411.

Although not illustrated, a flow meter (not illustrated) capable of measuring the flow rate per unit time of the liquid flowing through the line 411 may be provided in the line 411. In addition, when the liquid supplied to the supply nozzle 344 by the liquid supply unit 400 is an organic solvent, a nitrogen supply source (not illustrated) may be further connected to the tank 410. The nitrogen supply source (not illustrated) may supply nitrogen gas to the tank 410.

The circulation line 420 is connected to the tank 410. The circulation line 420 circulate s the liquid stored in the tank 410. A pump 430 and a back pressure valve 470 are provided in the circulation line 420. In addition, supply lines 440, 450, and 460 are connected to the circulation line 420. The supply lines 440, 450, and 460 are connected to the circulation line 420 between a position where the pump 430 is provided and a position where the back pressure valve 470 is provided in the circulation line 420.

Hereinafter, upstream and downstream of the circulation line 420 are defined based on the supply lines 440, 450, and 460 connected to the circulation line 420. For example, the circulation line 420 between the pump 430 and the supply lines 440, 450, and 460 is defined as the upstream of the circulation line 420, and the circulation line 420 between the supply lines 440, 450, and 460 and the back pressure valve 470 is defined as the downstream of the circulation line 420. The liquid stored in the tank 410 may flow back to the tank 410 through the pump 430, the supply lines 440, 450, and 460, and the back pressure valve 470. The upstream of the circulation line 420 may be provided with a pump 430, a second discharge line 404, a heater 433, a second pressure gauge 434, a second filter 435, a second valve 436, and a third pressure gauge 437.

The pump 430 is provided at the upstream of the circulation line 420. The pump 430 provides fluidity in the circulation line 420 so that the liquid stored in the storage space of the tank 410 flows along the circulation line 420. According to the exemplary embodiment, the pump 430 may be a bellows type pump using a fluid pressure. The flow rate per unit time of the liquid flowing upstream of the circulation line 420 may be adjusted by changing the fluid pressure supplied to the pump 430.

The fluid pressure supplied to the pump 430 may be changed by a first electro-pneumatic regulator 432. The first electro-pneumatic regulator 432 may change a fluid pressure supplied to the pump 430 by feeding-back distribution flow rate data measured by flow meters 442, 452, and 462 to be described below. For example, the first electro-pneumatic regulator 432 may change a fluid pressure supplied to the pump 430 by receiving a flow rate control signal transmitted from the controller 15 according the distribution flow rate measured by the flow meters 442, 452, and 462. A detailed mechanism thereof will be described below.

The second discharge line 404, the heater 433, the second pressure gauge 434, the second filter 435, the second valve 436, and the third pressure gauge 437 may be provided downstream of the pump 430.

The second discharge line 404 is connected to the circulation line 420. A decompression member (not illustrated) is provided in the second discharge line 404 to drain the liquid flowing in the circulation line 420 to the outside of the circulation line 420.

The heater 433 heats the liquid flowing through the circulation line 420. For example, the heater 433 heats the liquid flowing upstream of the circulation line 420 so that the liquid is heated to a temperature suitable for process requirements. Although a single heater 433 is illustrated in the drawing, a plurality of heaters 433 may be provided upstream of the circulation line 420. The second pressure gauge 434 may be provided at a position adjacent to the pump 430 in the upstream of the circulation line 420. The second pressure gauge 434 may measure the pressure of the liquid flowing upstream of the circulation line 420. The second filter 435 removes impurities that may be included in the liquid upstream of the circulation line 420.

The second valve 436 may be an opening/closing valve. When the second valve 436 is opened, the liquid flows from the upstream of the circulation line 420 to the downstream of the circulation line 420. Unlike this, when the second valve 436 is closed, the flow of the liquid from the upstream of the circulation line 420 to the downstream of the circulation line 420 is blocked. The third pressure gauge 437 may be provided downstream of the second valve 436.

Unlike those described above, the positions of the second discharge line 404, the heater 433, the second pressure gauge 434, the second filter 435, the second valve 436, and the third pressure gauge 437 may be variously changed in the circulation line 420.

The supply lines 440, 450, 460 are connected to the circulation line 420. The first supply line 440 is connected to the circulation line 420. The first supply line 440 connects the circulation line 420 and a first chamber 300*a* to each other. The second supply line 450 is connected to the circulation line 420. The second supply line 450 connects the circulation line 420 and a second chamber 300*b* to each other. The third supply line 460 is connected to the circulation line 420. The third supply line 460 connects the circulation line 420 and a third chamber 300*c* to each other. The first supply line 440 may be connected to the circulation line 420 closer to the pump 430 than the second supply line 450. In addition, the second supply line 450 may be connected to the circulation line 420 closer to the pump 430 than the third supply line 460.

A first flow meter 442, a first constant pressure valve 444, and a first supply valve 446 may be provided in the first supply line 440. The first flow meter 442, the first constant pressure valve 444, and the first supply valve 446 may be provided sequentially from the upstream of the first supply line 440. The first flow meter 442 may measure the flow rate of the liquid per unit time flowing through the first supply line 440. That is, the first flow meter 442 may measure the flow rate distributed from the circulation line 420 to the first supply line 440. Hereinafter, the flow rate per unit time of the liquid flowing upstream of the first constant pressure valve 444 to be described below in the first supply line 440 is defined as a first distribution flow rate. According to the exemplary embodiment, the first flow meter 442 measures the first distribution flow rate and transmits first distribution flow data to the controller 15.

According to the exemplary embodiment, the first constant pressure valve 444 may be a constant pressure valve. The liquid passing through the first constant pressure valve 444 may have a constant flow rate. The flow rate per unit time of the liquid passing through the first constant pressure valve 444 may be constantly maintained as a reference flow rate. According to the exemplary embodiment, the liquid having the reference flow rate that has passed through the first constant pressure valve 444 is transmitted to a supply nozzle provided in the first chamber 300*a*.

The first supply valve 446 is provided as an opening/closing valve. When the first supply valve 446 is opened, the liquid circulated in the circulation line 420 is transmitted to the first chamber 300*a* via the first supply line 440. Unlike this, when the first supply valve 446 is opened, the liquid does not flow into the first supply line 440 and continues to be circulated in the circulation line 420.

A second flow meter 452, a second constant pressure valve 454, and a second supply valve 456 may be provided in the second supply line 450. A third flow meter 462, a third constant pressure valve 464, and a third supply valve 466 may be provided in the third supply line 460. The second flow meter 452 and the third flow meter 462 according to the exemplary embodiment are provided equally or similarly to the first flow meter 442 described above. In addition, the second constant pressure valve 454 and the third constant pressure valve 464 are provided equally or similarly to the first constant pressure valve 444 described above. In addition, the second supply valve 456 and the third supply valve 466 are provided equally or similarly to the first supply valve 446 described above. Accordingly, hereinafter, the duplicated description of the second flow meter 452, the second constant pressure valve 454, the second supply valve 456, the third flow meter 462, the third constant pressure valve 464, and the third supply valve will be omitted.

The back pressure valve 470 and the third valve 438 may be provided downstream of the circulation line 420.

The back pressure valve 470 is provided in the circulation line 420. According to the exemplary embodiment, the back pressure valve 470 is provided downstream of the circulation line 420. The back pressure valve 470 may adjust the flow rate per unit time of the liquid flowing downstream of the circulation line 420. The back pressure valve 470 according to the exemplary embodiment may be a back pressure control valve (HIBV) of which an opening rate is changed according to a change in pressure. For example, as the pressure applied to the back pressure valve 470 increases, the opening rate of the back pressure valve 470 may decrease. When the opening rate of the back pressure valve 470 decreases, the flow rate per unit time of the liquid flowing downstream of the circulation line 420 may increase. For example, as the pressure applied to the back pressure valve 470 increases, the opening rate of the back pressure valve 470 may decrease.

The pressure applied to the back pressure valve 470 may be changed by a second electro-pneumatic regulator 472. The second electro-pneumatic regulator 472 may change a pressure applied to the back pressure valve 470 by feeding-back distribution flow rate data measured by the flow meters 442, 452, and 462. For example, the second electro-pneumatic regulator 472 may change a pressure transmitted to the back pressure valve 470 by receiving a flow rate control signal transmitted from the controller 15 according the distribution flow rate measured by the flow meters 442, 452, and 462. A detailed mechanism thereof will be described below.

The third valve 438 may be provided downstream of the second valve 436 back pressure valve 470. For example, the third valve 438 may be an opening/closing valve. When the third valve 438 is opened, the liquid is recovered to the tank 410 from the downstream of the circulation line 420.

In the above-described exemplary embodiment, for convenience of understanding, it has been described as an example that the three supply lines 440, 450, and 460 are connected to the circulation line 420, but is not limited thereto. For example, two or at least four supply lines may be connected to the circulation line 420.

Hereinafter, a substrate treating method according to an exemplary embodiment of the present invention will be described in detail. The substrate processing method to be described below may be performed in the liquid supply unit 400 described above. In addition, the controller 15 may control components included in the liquid supply unit 400 to perform the substrate treating method to be described below.

Figure 5:
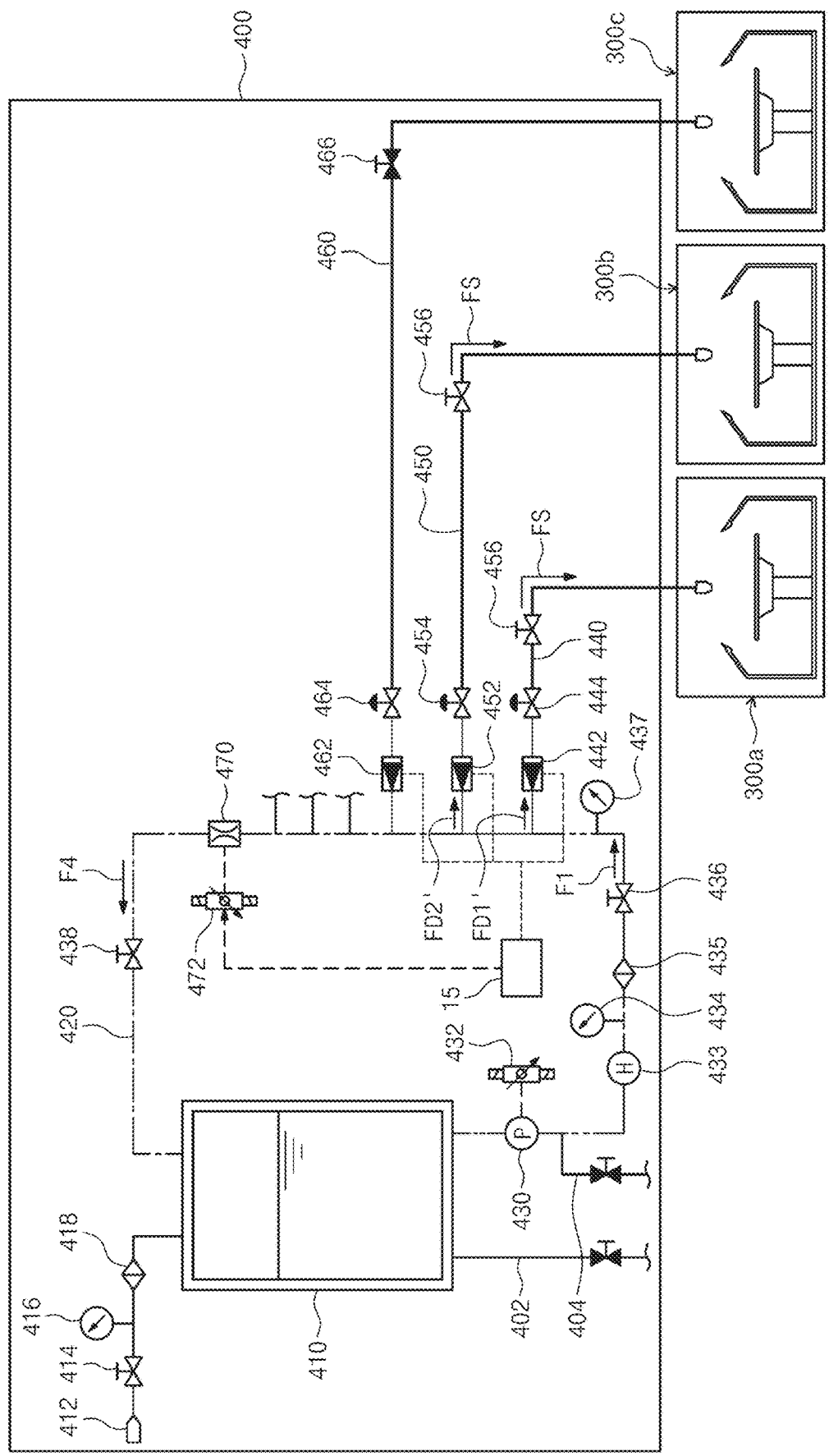
FIG. 5 is a diagram schematically illustrating an exemplary embodiment in which the liquid supply unit of FIG. 3 controls a flow rate of the liquid to the chamber in a second state.

FIG. 4 is a diagram schematically illustrating a state in which the liquid supply unit of FIG. 3 supplies a liquid to a chamber in a first state. FIG. 5 is a diagram schematically illustrating an embodiment in which the liquid supply unit of FIG. 3 controls a flow rate of the liquid to the chamber in a second state.

The liquid supply unit 400 may supply a liquid to at least one chamber 300. For example, as illustrated in FIG. 4, the liquid supply unit 400 may supply the liquid to the three chambers 300a, 300b, and 300c. Unlike this, as illustrated in FIG. 5, the liquid supply unit 400 may supply the liquid to the two chambers 300a and 300b.

Hereinafter, for convenience of understanding, as illustrated in FIG. 4, a state in which the liquid supply unit 400 supplies the liquid to the three chambers 300a, 300b, and 300c is defined as a first state, and a state in which the liquid supply unit 400 supplies the liquid to the two chambers 300a and 300b is defined as a second state. However, the present invention is not limited thereto, and the first state means a state in which the liquid supply unit 400 supplies the liquid to at least one chamber 300 among the plurality of chambers 300, and the second state means a state in which the liquid supply unit 400 supplies the liquid to a relatively smaller number of chambers 300 than that of the first state among the plurality of chambers 300.

As illustrated in FIG. 4, the flow rate per unit time of the liquid flowing upstream of the circulation line 420 in the first state may be a first flow rate F1. In addition, the flow rate per unit time of the liquid flowing downstream of the circulation line 420 in the first state may be a second flow rate F2. In addition, in the first state, the liquid having a first distribution flow rate FD1 may pass through the first flow meter 442. In addition, in the first state, the liquid having a second distribution flow rate FD2 may pass through the second flow meter 452. In addition, in the first state, the liquid having a third distribution flow rate FD3 may pass through the third flow meter 462. In addition, in the first state, the flow rate per unit time of the liquid passing through the first constant pressure valve 444, the second constant pressure valve 454, and the third constant pressure valve 464 may all have a reference flow rate FS.

As illustrated in FIG. 5, in the case of the second state in which the liquid supply unit 400 supplies the liquid to the first chamber 300a and the second chamber 300b among the first chamber 300a, the second chamber 300b, and the third chamber 300c, the liquid may not flow in the third supply line 460. When the capacity of the pump 430 is constant and the first state is changed to the second state without changes in the fluid pressure supplied to the pump 430 and the pressure applied to the back pressure valve 470, due to a differential pressure between the upstream and the downstream of the circulation line 420, a first distribution flow rate FD1' passing through the first flow meter 442 in the second state may be greater than the first distribution flow rate FD1 passing through the first flow meter 442 in the first state. In addition, a second distribution flow rate FD2' passing through the second flow meter 452 in the second state may be greater than the second distribution flow rate FD2 passing through the second flow meter 452 in the first state.

Accordingly, the controller 15 controls the second electro-pneumatic regulator 472 to change the first distribution flow rate FD1' passing through the first flow meter 442 in the second state. For example, the controller 15 controls the second electro-pneumatic regulator 472 so that the first distribution flow rate FD1' in the second state is changed to the first distribution flow rate FD1 in the first state. In addition, the controller 15 controls the second electro-pneumatic regulator 472 so that the second distribution flow rate FD2' in the second state is changed to the second distribution flow rate FD2 in the first state.

The controller 15 according to the exemplary embodiment of the present invention receives distribution flow rate data, which is the flow rate per unit time of the liquid measured by the flow meters 442, 452, and 462. The controller 15 determines a state change between the first state and the second state based on the received distribution flow data. When the controller 15 determines that the state has been changed from the first state to the second state, the controller 15 transmits a flow rate control signal to the second electro-pneumatic regulator 472. The second electro-pneumatic regulator 472 receiving the flow rate control signal from the controller 15 changes the pressure applied to the back pressure valve 470. According to the exemplary embodiment, when the first state is changed to the second state, the controller 15 transmits a downstream flow rate increase signal to the second electro-pneumatic regulator 472. Accordingly, the second electro-pneumatic regulator 472 reduces the pressure applied to the back pressure valve 470. When the pressure applied to the back pressure valve 470 decreases, the opening rate of the back pressure valve 470 may increase. As the opening rate of the back pressure valve 470 increases, the flow rate per unit time of the liquid passing through the back pressure valve 470 may increase. Accordingly, the flow rate per unit time of the liquid passing through the downstream of the circulation line 420 may increase. For example, the flow rate per unit time of the liquid passing through the downstream of the circulation line 420 is changed from the second flow rate F2 in the first state to a fourth flow rate F4 greater than the second flow rate F2. As the flow rate per unit time of the liquid flowing downstream of the circulation line 420 increases, the difference in pressure between the upstream and the downstream of the circulation line 420 decreases, so that in the second state, the first distribution flow rate FD1' may decrease. Accordingly, the first distribution flow rate FD1' may be changed to the first distribution flow rate FD1 in the first state. In addition, in the second state, the second distribution flow rate FD2' may decrease. Accordingly, the second distribution flow rate FD2' may be changed to the second distribution flow rate FD2 in the first state. When the number of chambers 300 to which the liquid is supplied is changed, the flow rate per unit time of the liquid flowing into the constant pressure valves 444, 454, and 464 may be changed. When the flow rate per unit time of the liquid flowing into the constant pressure valves 444, 454, and 464 increases, the flow rate per unit time of the liquid flowing out of the constant pressure valves 444, 454, and 464 may be maintained at the reference flow rate, but the constant pressure valve may be damaged. When the flow rate per unit time of the liquid flowing out of the constant pressure valve is not maintained at the reference flow rate due to the damage to the constant pressure valve, the liquid is not supplied to the substrates located inside the chambers 300 at a constant flow rate. When the liquid having an excessive flow rate is supplied to the chamber 300 due to the damage to the constant pressure valve, the substrate may be damaged. In addition, when a liquid having a small flow rate is supplied to the chamber 300 due to the damage of the constant pressure valve, particles attached to the substrate may not be easily removed. In addition, particles generated when the constant pressure valve is damaged may flow into the chamber 300 together with the liquid to be attached to the substrate.

Accordingly, according to one embodiment of the present invention described above, even when the number of chambers 300 to which the liquid is supplied is varied, the distribution flow rate, which is the flow rate per unit time of the liquid flowing into the constant pressure valve, may be maintained constantly by varying the flow rate per unit time of the liquid flowing downstream of the circulation line 420. Accordingly, it is possible to supply the liquid having a constant flow rate to the chambers 300 while preventing the damage to the constant pressure valve.

The substrate treating method to be described below is provided substantially the same as or similar to the substrate treating method according to the exemplary embodiment described with reference to FIG. 5 except for cases to be additionally described.

Figure 6:
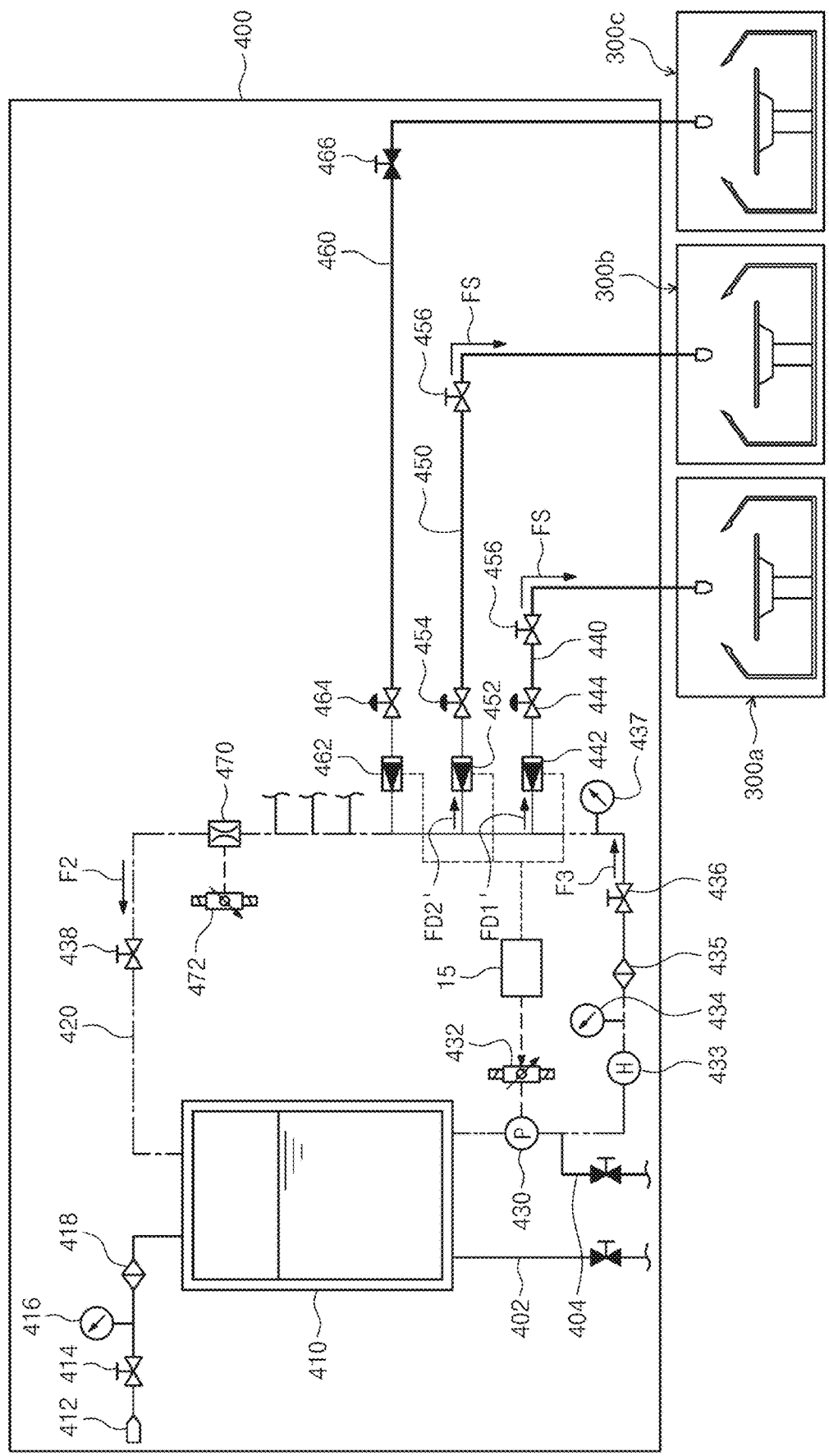
FIGS. 6 and 7 are diagrams schematically illustrating another exemplary embodiment in which the liquid supply unit of FIG. 3 controls a flow rate of the liquid supplied to the chamber in a second state.
Figure 7:
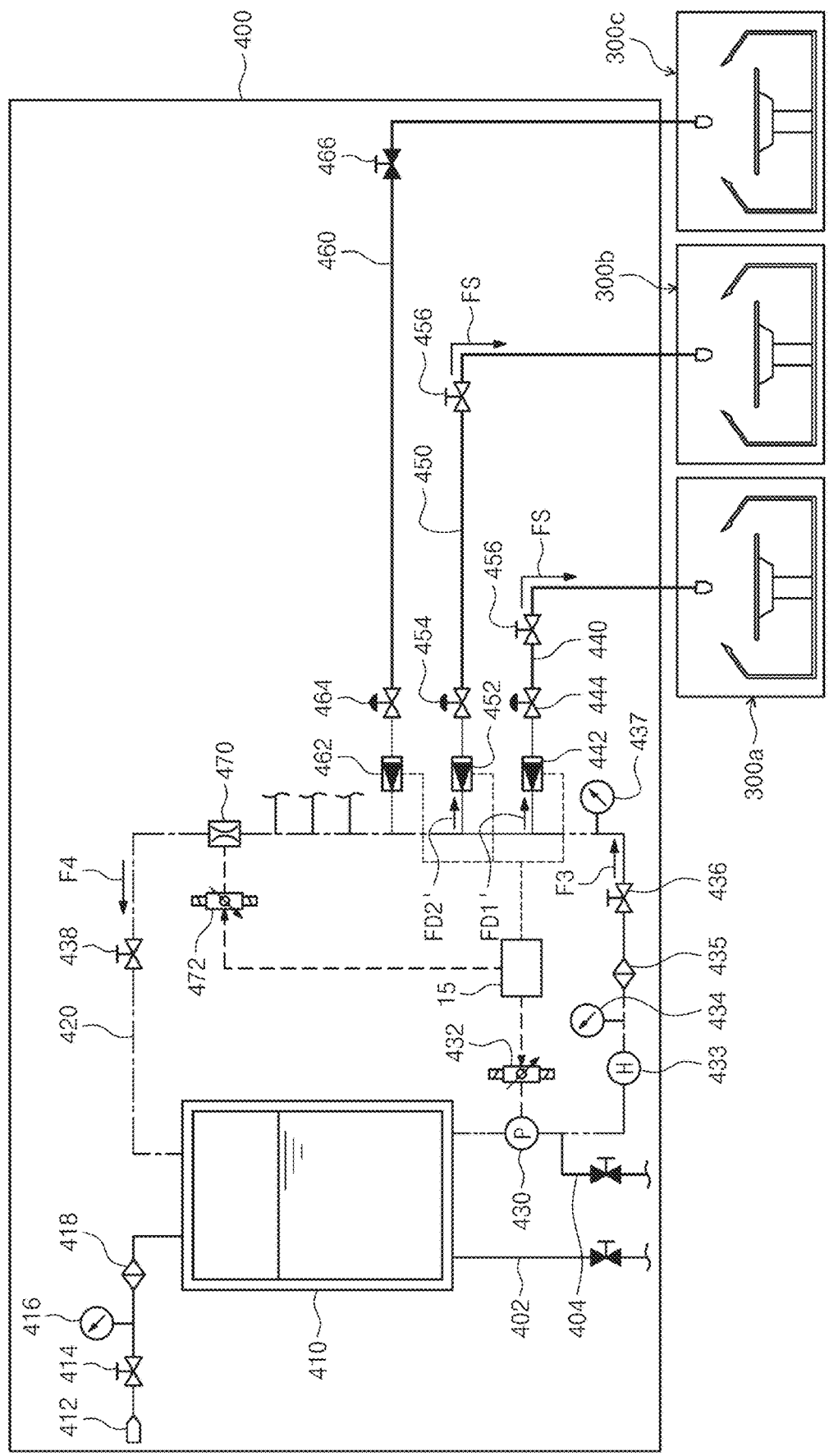

FIGS. 6 and 7 are diagrams schematically illustrating another exemplary embodiment in which the liquid supply unit of FIG. 3 controls a flow rate of the liquid supplied to the chamber in the second state.

Referring to FIG. 6, the controller 15 controls the first electro-pneumatic regulator 432 to change the first distribution flow rate FD1' passing through the first flow meter 442 in the second state. For example, the controller 15 controls the first electro-pneumatic regulator 432 so that the first distribution flow rate FD1' in the second state is changed to the first distribution flow rate FD1 in the first state. In addition, the controller 15 controls the first electro-pneumatic regulator 432 so that the second distribution flow rate FD2' in the second state is changed to the second distribution flow rate FD2 in the first state.

The controller 15 according to the exemplary embodiment of the present invention receives distribution flow rate data, which is the flow rate per unit time of the liquid measured by the flow meters 442, 452, and 462. The controller 15 determines a state change between the first state and the second state based on the received distribution flow data. When the controller 15 determines that the state has been changed from the first state to the second state, the controller 15 transmits a flow rate control signal to the first electro-pneumatic regulator 432. The first electro-pneumatic regulator 432 receiving the flow rate control signal from the controller 15 changes the fluid pressure supplied to the pump 430.

According to the exemplary embodiment, when the first state is changed to the second state, the controller 15 transmits an upstream flow rate decrease signal to the first electro-pneumatic regulator 432. Accordingly, the first electro-pneumatic regulator 432 reduces the fluid pressure supplied to the pump 430. When the fluid pressure supplied to the pump 430 is reduced, the flow rate per unit time of the liquid flowing upstream of the circulation line 420 may decrease. For example, the flow rate per unit time of the liquid flowing upstream of the circulation line 420 is changed from the first flow rate F1 in the first state to a third flow rate F3 smaller than the first flow rate F1.

As the flow rate per unit time of the liquid flowing upstream of the circulation line 420 decreases, the difference in pressure between the upstream and the downstream of the circulation line 420 decreases, so that in the second state, the first distribution flow rate FD1' may decrease. Accordingly, the first distribution flow rate FD1' may be changed to the first distribution flow rate FD1 in the first state. In addition, in the second state, the second distribution flow rate FD2' may decrease. Accordingly, the second distribution flow rate FD2' may be changed to the second distribution flow rate FD2 in the first state. Referring to FIG. 6, according to the exemplary embodiment of the present invention described above, even when the number of chambers 300 to which the liquid is supplied is varied, the distribution flow rate, which is the flow rate per unit time of the liquid flowing into the constant pressure valve, may be maintained constantly by varying the flow rate per unit time of the liquid flowing upstream of the circulation line 420. Accordingly, it is possible to supply the liquid having a constant flow rate to the chambers 300 while preventing the damage to the constant pressure valve.

Referring to FIG. 7, the controller 15 controls the first electro-pneumatic regulator 432 to change the first distribution flow rate FD1' passing through the first flow meter 442 in the second state. For example, the controller 15 controls the first electro-pneumatic regulator 432 so that the first distribution flow rate FD1' in the second state is changed to the first distribution flow rate FD1 in the first state. In addition, the controller 15 controls the first electro-pneumatic regulator 432 so that the second distribution flow rate FD2' in the second state is changed to the second distribution flow rate FD2 in the first state.

The controller 15 according to the exemplary embodiment of the present invention receives distribution flow rate data, which is the flow rate per unit time of the liquid measured by the flow meters 442, 452, and 462. The controller 15 determines a state change between the first state and the second state based on the received distribution flow data. When the controller 15 determines that the state has been changed from the first state to the second state, the controller 15 transmits a flow rate control signal to the first electro-pneumatic regulator 432 and the second electro-pneumatic regulator 472. The first electro-pneumatic regulator 432 receiving the flow rate control signal from the controller 15 changes the fluid pressure supplied to the pump 430. In addition, the second electro-pneumatic regulator 472 receiving the flow rate control signal from the controller 15 changes the pressure applied to the back pressure valve 470.

According to the exemplary embodiment, when the first state is changed to the second state, the controller 15 transmits an upstream flow rate decrease signal to the first electro-pneumatic regulator 432. Accordingly, the first electro-pneumatic regulator 432 reduces the fluid pressure supplied to the pump 430. When the fluid pressure supplied to the pump 430 is reduced, the flow rate per unit time of the liquid flowing upstream of the circulation line 420 may decrease. For example, the flow rate per unit time of the liquid flowing upstream of the circulation line 420 is changed from the first flow rate F1 in the first state to a third flow rate F3 smaller than the first flow rate F1.

In addition, when the first state is changed to the second state, the controller 15 transmits a downstream flow rate increase signal to the second electro-pneumatic regulator 472. Accordingly, the second electro-pneumatic regulator 472 reduces the pressure applied to the back pressure valve 470. When the pressure applied to the back pressure valve 470 decreases and the opening rate of the back pressure valve 470 increases, the flow rate per unit time of the liquid flowing downstream of the circulation line 420 may increase. For example, the flow rate per unit time of the liquid passing through the downstream of the circulation line 420 is changed from the second flow rate F2 in the first state to a fourth flow rate F4 greater than the second flow rate F2.

As the flow rate per unit time of the liquid flowing upstream of the circulation line 420 decreases and the flow rate per unit time of the liquid flowing downstream of the circulation line 420 increases, the difference in pressure between the upstream and the downstream of the circulation line 420 decreases. Accordingly, the first distribution flow rate FD1' may be changed to the first distribution flow rate FD1 in the first state. In addition, the second distribution flow rate FD2' may be changed to the second distribution flow rate FD2 in the first state.

Referring to FIG. 7, according to the exemplary embodiment of the present invention described above, even when the number of chambers 300 to which the liquid is supplied is varied, the difference in pressure between the upstream and the downstream of the circulation line 420 may be more precisely changed by varying flow rates per unit time of the liquid flowing upstream and downstream of the circulation line 420, respectively. Accordingly, the distribution flow rate, which is the flow rate per unit time of the liquid flowing into the constant pressure valve, may be constantly maintained. Accordingly, it is possible to supply the liquid having a constant flow rate to the chambers 300 while preventing the damage to the constant pressure valve.

Figure 8:
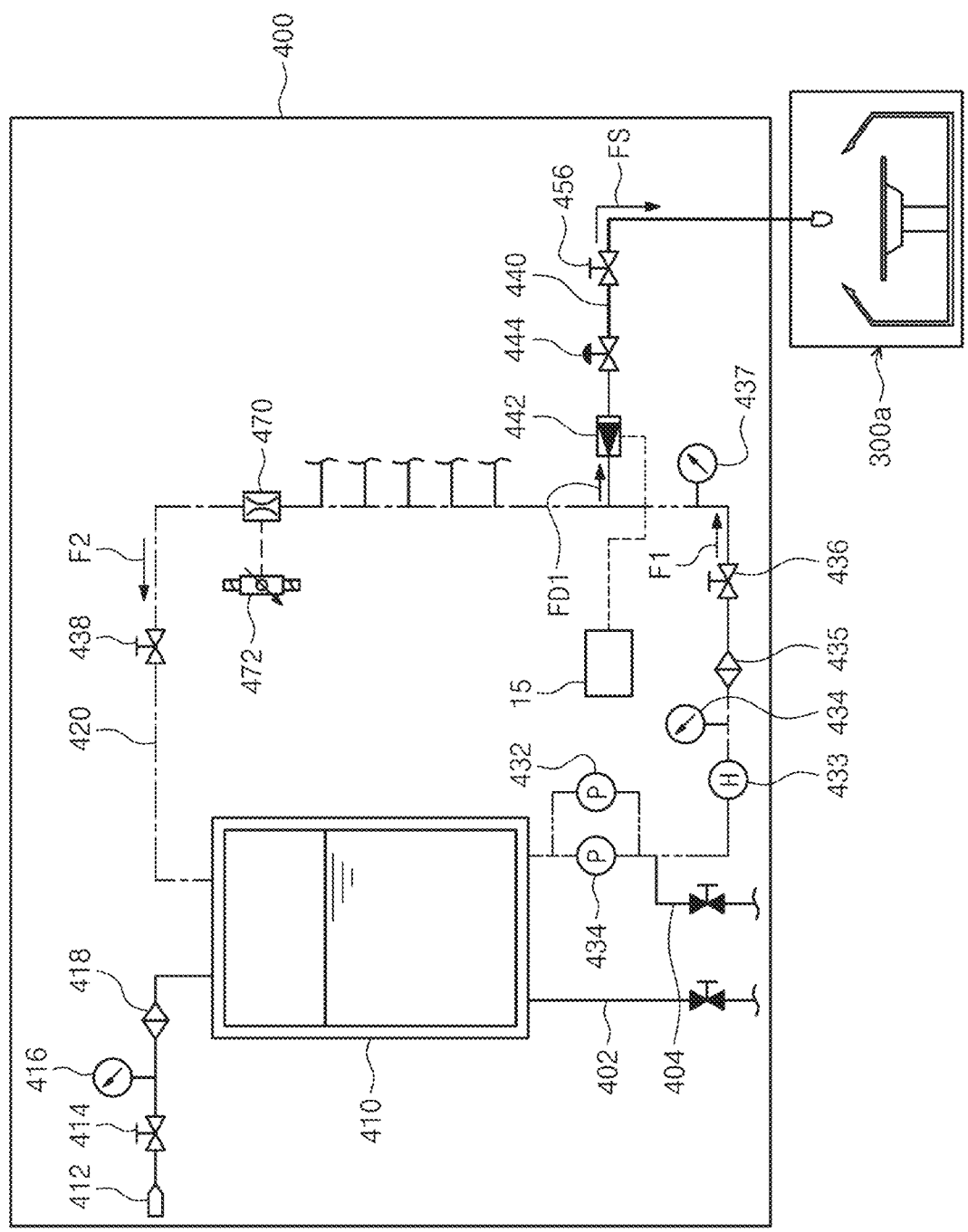
FIG. 8 is a diagram schematically illustrating another exemplary embodiment of the state in which the liquid supply unit of FIG. 3 supplies the liquid to the chamber in the first state.
Figure 9:
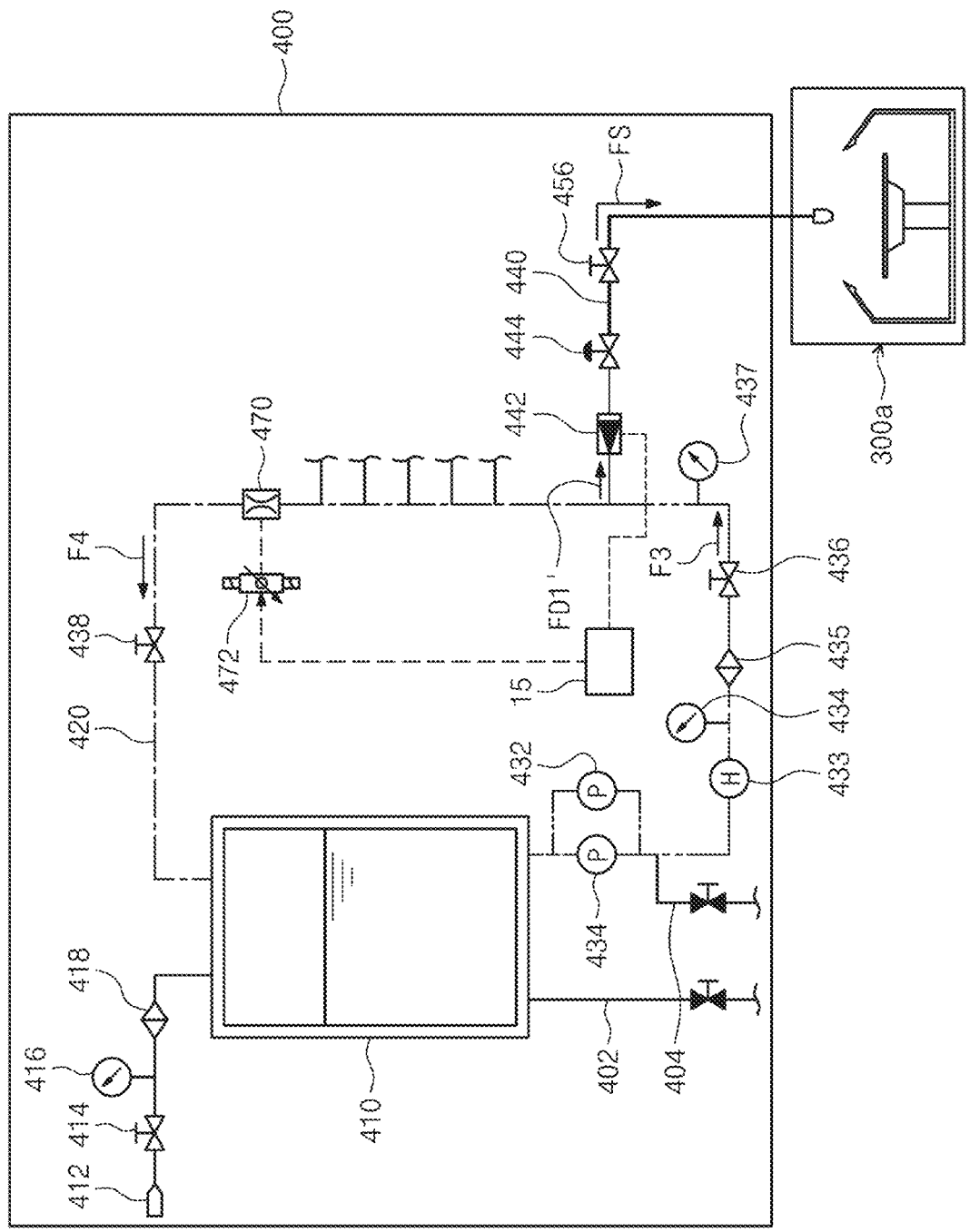
FIG. 9 is a diagram schematically illustrating another exemplary embodiment of the state in which the liquid supply unit of FIG. 3 supplies the liquid to the chamber in the second state.

FIG. 8 is a diagram schematically illustrating another exemplary embodiment of the state in which the liquid supply unit of FIG. 3 supplies the liquid to the chamber in the first state. FIG. 9 is a diagram schematically illustrating another exemplary embodiment of the state in which the liquid supply unit of FIG. 3 supplies the liquid to the chamber in the second state.

Referring to FIGS. 8 and 9, the liquid supply unit 400 may supply a liquid to the first chamber 300a. Hereinafter, for convenience of understanding, it has been described as an example in which the liquid supply unit 400 supplies the liquid only to the first chamber 300a, but it is not limited thereto, and the liquid supply unit 400 may supply the liquid simultaneously to a plurality of chambers.

The liquid supply unit 400 may have a first pump 432 and a second pump 434. The first pump 432 may be a pump having a first capacity. The second pump 434 may be a pump having a second capacity. According to the exemplary embodiment, the first capacity may be smaller than the second capacity.

As illustrated in FIG. 8, the liquid supply unit 400 may supply the liquid to the circulation line 420 using the first pump 432. The first pump 432 having the first capacity may transmit the liquid having the first flow rate F1 per unit time to the upstream of the circulation line 420. In addition, as illustrated in FIG. 9, the liquid supply unit 400 may supply the liquid to the circulation line 420 using the second pump 434. The second pump 434 having the second capacity may transmit the liquid having the third flow rate F3 per unit time to the upstream of the circulation line 420. According to the exemplary embodiment, the first flow rate F1 may be smaller than the third flow rate F3.

When the state of supplying the liquid to the chamber 300 using the first pump 432 is changed to the state of supplying the liquid to the chamber 300 using the second pump 434, in the case where the pressure applied to the back pressure valve 470 is not changed, the first distribution flow rate may be changed due to a differential pressure between the upstream and the downstream of the circulation line 420. For example, the first distribution flow rate FD1' passing through the first flow meter 442 when using the second pump 434 may be greater than the first distribution flow rate FD1 passing through the first flow meter 442 when using the first pump 432.

Accordingly, the controller 15 controls the second electro-pneumatic regulator 472 to change the first distribution flow rate FD1' passing through the first flow meter 442. The controller 15 according to the exemplary embodiment of the present invention receives distribution flow rate data, which is the flow rate per unit time of the liquid measured by the first flow meter 442. The controller 15 determines whether to change the capacity of the pump 430 based on the received distribution flow rate data. When the controller 15 determines that the capacity of the pumps 432 and 434 is changed, the controller 15 transmits a flow rate control signal to the second electro-pneumatic regulator 472. The second electro-pneumatic regulator 472 receiving the flow rate control signal from the controller 15 changes the pressure applied to the back pressure valve 470.

According to the exemplary embodiment, when the first pump 432 is changed to the second pump 434, the controller 15 transmits a downstream flow rate increase signal to the second electro-pneumatic regulator 472. Accordingly, the second electro-pneumatic regulator 472 reduces the pressure applied to the back pressure valve 470. When the pressure applied to the back pressure valve 470 decreases, the opening rate of the back pressure valve 470 may increase. As the opening rate of the back pressure valve 470 increases, the flow rate per unit time of the liquid passing through the back pressure valve 470 may increase. Accordingly, the flow rate per unit time of the liquid passing through the downstream of the circulation line 420 may increase. For example, the flow rate per unit time of the liquid passing through the downstream of the circulation line 420 is changed to the fourth flow rate F4 greater than the second flow rate F2 which is the flow rate per unit time of the liquid passing through the downstream of the circulation line 420 when the first pump 422 is used. As the flow rate per unit time of the liquid flowing downstream of the circulation line 420 increases, the difference in pressure between the upstream and the downstream of the circulation line 420 decreases, so that the first distribution flow rate FD1' may decrease. That is, the controller 15 changes the first distribution flow rate FD1' according to a change value of the distribution flow rate. For example, the controller 15 may change the first distribution flow rate FD1' to be similar to the first distribution flow rate FD1 when the first pump 422 is used.

Therefore, according to the exemplary embodiment of the present invention described above, even if the capacity of the pump 430 is changed and the flow rate per unit time of the liquid flowing upstream of the circulation line 420 is changed, the distribution flow rate, which is the flow rate per unit time of the liquid flowing into the constant pressure valve, may be maintained constantly by changing the flow rate per unit time of the liquid flowing downstream of the circulation line 420. Accordingly, it is possible to supply the liquid having a constant flow rate to the chambers 300 while preventing the damage to the constant pressure valve.

In the exemplary embodiment of the present invention described above, it has been described as an example in which the flow rate per unit time of the liquid flowing into the constant pressure valve is changed according to the change in the number of chambers to which the liquid is supplied or the flow rate of the pump supplying the liquid, but is not limited thereto. For example, the present invention may be equally applied to even when the flow rate per unit time of the liquid flowing through the circulation line 420 is changed according to the opening and closing of the second discharge line 404 for discharging the liquid flowing through the circulation line 420.

The foregoing detailed description illustrates the present invention. Further, the above content shows and describes the exemplary embodiment of the present invention, and the present invention can be used in various other combinations, modifications, and environments. That is, the foregoing contents may be modified or corrected within the scope of the concept of the invention disclosed in the present specification, the scope equivalent to that of the disclosure, and/or the scope of the skill or knowledge in the art. Accordingly, the detailed description of the invention above is not intended to limit the invention to the disclosed exemplary embodiment. Further, the accompanying claims should be construed to include other exemplary embodiments as well. These modifications should not be understood individually from the technical idea and prospects of the present invention.

What is claimed is:

1. A substrate treating method for treating a substrate in a plurality of chambers comprising:
    performing liquid treatment on a substrate located in a chamber through a supply line for connecting a circulation line and each of the plurality of chambers while the liquid circulates in the circulation line, wherein a flow rate per unit time of the liquid flowing downstream of a valve provided in the supply line is constantly maintained at a reference flow rate, and
    controlling an upstream flow rate, which is a flow rate per unit time of the liquid flowing upstream of the circulation line rather than the supply lines, or controlling a downstream flow rate, which is a flow rate per unit time of the liquid flowing downstream of the circulation line rather than the supply lines, the controlling based on a distribution flow rate, which is a flow rate per unit time of the liquid flowing upstream of the valve to maintain the reference flow rate, the controlling based on a flow meter located upstream of the valve in each of the supply lines, wherein
    the valve is a constant pressure valve, and
    the distribution flow rate is measured using the each of the flow meters, and an opening rate of the constant pressure valve is maintained constantly while the liquid treatment on the substrate is performed.

2. The substrate treating method of claim 1, wherein a pump and a first electro-pneumatic regulator are provided at an upstream of the circulation line to supply the liquid downstream of the circulation line using a fluid pressure, and
    the first electro-pneumatic regulator controls the upstream flow rate by feeding-back distribution flow rate data and changing the fluid pressure supplied to the pump.

3. A substrate treating method for treating a substrate in a plurality of chambers comprising:
    performing liquid treatment on a substrate located in a chamber through a supply line for connecting a circulation line and each of the plurality of chambers while the liquid circulates in the circulation line, wherein a flow rate per unit time of the liquid flowing downstream of a valve provided in the supply line is constantly maintained at a reference flow rate,
    controlling an upstream flow rate which is a flow rate per unit time of the liquid flowing upstream of the circulation line rather than the supply lines or a downstream flow rate which is a flow rate per unit time of the liquid flowing downstream of the circulation line rather than the supply lines based on a distribution flow rate which is a flow rate per unit time of the liquid flowing upstream of the valve to maintain the reference flow rate,
    wherein a pump and a first electro-pneumatic regulator are provided at an upstream of the circulation line to supply the liquid downstream of the circulation line using a fluid pressure,
    the first electro-pneumatic regulator controls the upstream flow rate by feeding-back distribution flow rate data and changing the fluid pressure supplied to the pump,
    wherein a back pressure valve and a second electro-pneumatic regulator are provided at a downstream of the circulation line to change an opening rate according to the pressure, and
    the second electro-pneumatic regulator changes the pressure supplied to the back pressure valve by feeding-back the distribution flow rate data, and changes the opening rate according to the changed pressure to control the downstream flow rate.

4. The substrate treating method of claim 3, wherein the method comprises a first state in which the liquid treatment is performed in at least one of the plurality of chambers and a second state in which the liquid treatment is performed in a relatively smaller number of chambers than that of the first state, and
    in each of the first state and the second state, the upstream flow rate or the downstream flow rate is controlled differently from each other.

5. The substrate treating method of claim 4, wherein in the second state, the fluid pressure supplied to the pump is further reduced than that in the first state, and the upstream flow rate in the second state is controlled to be smaller than the upstream flow rate in the first state.

6. The substrate treating method of claim 4, wherein in the second state, the fluid pressure supplied to the back pressure valve is further reduced than that in the first state to increase the opening rate, and the downstream flow rate in the second state is controlled to be greater than the downstream flow rate in the first state.

7. The substrate treating method of claim 4, wherein the upstream flow rate in the second state is controlled to be smaller than the upstream flow rate in the first state, and the downstream flow rate in the second state is controlled to be greater than the downstream flow rate in the first state.

8. The substrate treating method of claim 1, further comprising:
    heating the liquid with a heater in the circulation line.

9. The substrate treatment method of claim 1, further comprising:
    storing the liquid in a tank, the tank in fluid communication with the circulation line.

10. The substrate treatment method of claim 9, further comprising:

controlling a level of the liquid in the tank with at least one discharge line.

11. The substrate treatment method of claim 1, wherein the supply line is provided in plural, and
the flow meter is provided in plural.

12. The substrate treatment method of claim 11, wherein the valve is provided in plural.

13. The substrate treatment method of claim 11, further comprising:
controlling a plurality of second valves in the respective plurality of supply lines.

14. The substrate treatment method of claim 13, wherein each of the plurality of second valves is downstream from a respective one of the plurality of flow meters and a respective one of the plurality of valves.

15. The substrate treatment method of claim 4, further comprising:
heating the liquid with a heater in the circulation line.

16. The substrate treatment method of claim 4, wherein the valve is a constant pressure valve,
a flow meter located upstream of the constant pressure valve is provided in each of the supply lines, and
the distribution flow rate is measured using the each of the flow meters, and an opening rate of the constant pressure valve is maintained constantly while the liquid treatment on the substrate is performed.

* * * * *